(12) United States Patent
Choi

(10) Patent No.: US 9,484,486 B2
(45) Date of Patent: Nov. 1, 2016

(54) PIN DIODE AND MANUFACTURING METHOD THEREOF, AND X-RAY DETECTOR USING PIN DIODE AND MANUFACTURING METHOD THEREOF

(71) Applicant: Hydis Technologies Co., Ltd., Icheon-si, Gyeonggi-do (KR)

(72) Inventor: Sung Jin Choi, Icheon-si (KR)

(73) Assignee: Hydis Technologies Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/806,844

(22) Filed: Jul. 23, 2015

(65) Prior Publication Data
US 2016/0027952 A1    Jan. 28, 2016

(30) Foreign Application Priority Data

Jul. 24, 2014  (KR) .......................... 10-2014-0094134

(51) Int. Cl.
| | |
|---|---|
| H01L 21/00 | (2006.01) |
| H01L 31/18 | (2006.01) |
| H01L 31/115 | (2006.01) |
| H01L 31/105 | (2006.01) |
| H01L 31/20 | (2006.01) |

(52) U.S. Cl.
CPC ....... H01L 31/1888 (2013.01); H01L 31/1055 (2013.01); H01L 31/115 (2013.01); H01L 31/1884 (2013.01); H01L 31/202 (2013.01); Y02P 70/521 (2015.11)

(58) Field of Classification Search
CPC ................... H01L 31/1888; H01L 27/14659
USPC ............................. 257/458, 293, 443; 438/72
See application file for complete search history.

(56) References Cited

U.S. PATENT DOCUMENTS

| | | | |
|---|---|---|---|
| 5,262,649 A | 11/1993 | Antonuk et al. | |
| 6,229,192 B1* | 5/2001 | Gu ......................... | G02F 1/1365 257/293 |
| 2012/0140309 A1* | 6/2012 | Cho ....................... | B82Y 20/00 359/260 |
| 2013/0020585 A1* | 1/2013 | Ishibashi ............. | H01L 29/6606 257/77 |
| 2013/0306873 A1 | 11/2013 | Jun | |
| 2015/0171135 A1* | 6/2015 | Jun .................... | H01L 27/14663 250/366 |

OTHER PUBLICATIONS

Abstract of Korean Patent—KR 1020100085515 dated Jul. 29, 2010, 1 page.

* cited by examiner

*Primary Examiner* — Dung Le
(74) *Attorney, Agent, or Firm* — Dority & Manning, P.A.

(57) ABSTRACT

Provided herein is a PIN diode, a manufacturing method thereof, an x-ray detector using the PIN diode, and a manufacturing method thereof, the PIN diode manufacturing method according to an embodiment of the present disclosure including forming a lower electrode layer, and forming a lower electrode by etching the lower electrode layer; depositing a PIN layer for formation of a PIN structure above the lower electrode, and depositing an upper electrode layer for formation of the upper electrode above the PIN layer; forming a photo resist pattern above the upper electrode layer, and forming the upper electrode by etching the upper electrode layer having the photo resist pattern as a mask; forming the PIN structure by etching the PIN layer; etching an edge area of the upper electrode having the photo resist pattern as a mask; and removing the photo resist pattern.

12 Claims, 4 Drawing Sheets

PIN DIODE AND MANUFACTURING METHOD THEREOF, AND X-RAY DETECTOR USING PIN DIODE AND MANUFACTURING METHOD THEREOF

CROSS-REFERENCE TO RELATED APPLICATION

This application claims the benefit of priority under 35 U.S.C. §119(a) of Korean Patent Application No. 10-2014-0094134, filed on Jul. 24, 2014, in the Korean Intellectual Property Office, the entire disclosure of which is incorporated herein by reference for all purposes.

BACKGROUND

1. Field

The following description relates to a PIN diode and a manufacturing method thereof, and an x-ray detector using the PIN diode and a manufacturing method thereof. More particularly, the following description relates to a PIN diode configured to include a lower electrode, a PIN structure consisting of a P layer, a I layer, and a N layer electrically connected to the lower electrode, and an upper electrode, wherein a size of the PIN structure and a size of the upper electrode substantially correspond to each other so as to maximize a fill factor, and a manufacturing method thereof, and an x-ray detector using the PIN diode and a manufacturing method thereof.

2. Description of Related Art

Generally, x-rays have short wavelengths, and thus may easily penetrate an object. The amount of penetration of such x-rays depends on the density inside the object.

In other words, the inner state of the object can be observed indirectly based on the amount of x-rays that penetrated the object.

An x-ray detector is an apparatus for detecting an amount of x-rays that penetrated an object. The x-ray detector may detect an amount of penetration of x-rays, and display an inner state of the object through a display apparatus.

Generally, such an x-ray detector is used as a medical inspection apparatus, or a nondestructive inspection apparatus and the like.

The x-ray detector consists of a lower electrode, a PIN structure including a P layer, I layer, and N layer formed above the lower electrode, and an upper electrode formed above the PIN structure.

Herein, instead of being separately provided, the lower electrode may be made of a source electrode or a drain electrode of a thin film transistor. In a case where the lower electrode is separately provided, it may be configured to be electrically connected to a source electrode or a drain electrode of a thin film transistor through a contact hole.

FIG. 1 is a schematic diagram of a conventional x-ray detector. Referring to FIG. 1, the x-ray detector is provided with a thin film transistor that includes a gate electrode 110, a drain electrode 111, source electrode 112 and active pattern 13 on a substrate 100, and a lower electrode 120 electrically connected to the drain electrode 111 through a first contact hole 115 of a first protection film 114 formed above the drain electrode 111. The lower electrode 120 serves as an N side electrode.

Above the lower electrode 120, a PIN structure 130 is formed that includes an N type semiconductor pattern 131 formed on the lower electrode 120, an intrinsic semiconductor pattern 132 formed on the N type semiconductor pattern 131, and a P type semiconductor pattern 133 formed on the intrinsic semiconductor pattern 132.

For example, the N type semiconductor pattern 131 is made of Ni+a-Si, the intrinsic semiconductor pattern 132 is made of a-Si, and the P type semiconductor pattern 133 is made of P+a-Si.

Furthermore, the intrinsic semiconductor pattern 132 serves to absorb light being applied from outside and to generate electrons, and the P type semiconductor pattern 133 is formed to be as thin as possible so as to maximize the light penetration rate.

Furthermore, the upper electrode 140 is made of a transparent electrode material and is formed above the PIN structure 130.

Meanwhile, the thin film transistor, the lower electrode 120, the PIN structure 130 and the upper electrode 140 form one sensing pixel.

Above the upper electrode 140, a second protection film 150 having a second contact hole 151 is formed, and above the second protection film 150, bias wires are formed.

The bias wires include a main data wire 161, shield layer 162, and bias wire 163 and so on.

Above a result product where the bias wires are formed, a third protection film 170 is formed, and above the third protection film 170, an organic insulation layer 180 is formed.

A scintillator layer for converting the light of x-rays is attached to or formed on the organic insulation layer 180 by a depositing process.

Herein, the upper electrode 140 is desirably formed such that it corresponds to the size of the PIN structure 130 in consideration of the adhesive force with the PIN structure 130 and the optical conversion efficiency.

FIG. 2 is a diagram illustrating a conventional manufacturing method of an x-ray detector. Referring to FIG. 2, in the conventional manufacturing method of an x-ray detector, a thin film transistor (not illustrated) is formed on a substrate (not illustrated), and then a contact hole is formed on a protection film (not illustrated) formed above the thin film transistor, and then a lower electrode 120 is formed to be electrically connected to the thin film transistor through the contact hole.

Furthermore, above the lower electrode 120, a PIN layer 130A is deposited sequentially to form a PIN structure 130. Then, above the PIN layer 130A, an upper electrode layer 140A is deposited at a room temperature condition (about 23° C.).

Then, above the upper electrode layer 140A, a photo resist layer is deposited, and then exposed and developed to form a photo resist pattern 141.

Furthermore, using a wet etching process, the upper electrode layer 140A is etched to form an upper electrode 140.

The size of the pattern of the electrode formed by a wet etching process is generally smaller than that of the photo resist pattern 141. The extent of the reduced size is referred to as a CD Bias.

That is, the upper electrode 140 is excessively-etched than the photo resist pattern 141, and thus formed to have a smaller edge area and a CD Bias of about 2~3 μm.

Then, using a dry etching process, the PIN layer 130A is etched having the photo resist pattern 141 as a mask so as to form the PIN structure 130, and the photo resist pattern 141 is removed thereby completing the process of forming the lower electrode 120, PIN structure 130, and upper electrode 140.

The said process forms the upper electrode 140 and PIN structure 130 using one photo resist pattern 141, and thus each profile is determined according to the CD Bias of the upper electrode 140 and PIN structure 130.

Herein, it is desirable to match the CD Bias of the upper electrode 140 to the CD Bias of the PIN structure 130 so that the size of the upper electrode 140 is almost substantially the same as the size of the PIN structure.

By doing this, it is possible to maximize an amount of conversion into electrical signals with a same amount of visible rays.

The bigger the CD Bias of the upper electrode 140, that is, the smaller the size of the upper electrode 140 compared to the size of the PIN structure 130, the smaller the fill factor of the PIN diode.

The fill factor is a ratio of a light receiving area of a pixel unit in the x-ray detector. The smaller the fill factor, the smaller the amount of conversion into electrical signals even with a same amount of visible rays, thereby deteriorating the performance of the x-ray detector.

Meanwhile, since the upper electrode 140 is deposited at a room temperature, it is problematic in that its adhesive force with the PIN structure 130 is low, thereby causing the upper electrode 140 to come off in a subsequent process.

Meanwhile, besides the said x-ray detector, any apparatus where a PIN diode structure including a lower electrode, PIN structure, and upper electrode is applied may have the same problem.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A purpose of the present disclosure is to resolve the aforementioned problems of prior art, that is to provide a PIN diode wherein a size of an upper electrode of the PIN diode is formed such that it corresponds to a size of a PIN structure thereby maximizing a fill factor, and a manufacturing method thereof, and an x-ray detector using the PIN diode and a manufacturing method thereof.

Another purpose of the present disclosure is to provide a PIN diode wherein an upper electrode is deposited above the PIN diode at a high temperature thereby preventing the upper electrode from coming off, and a manufacturing method thereof, and an x-ray detector using the PIN diode and a manufacturing method thereof.

According to an aspect, there is provided a manufacturing method of a PIN diode having a lower electrode, a PIN structure consisting of a P layer, a I layer, and a N layer formed above the lower electrode, and an upper electrode formed above the PIN structure, the method including forming a lower electrode layer, and forming the lower electrode by etching the lower electrode layer; depositing a PIN layer for formation of the PIN structure above the lower electrode, and depositing an upper electrode layer for formation of the upper electrode above the PIN layer; forming a photo resist pattern above the upper electrode layer, and forming the upper electrode by etching the upper electrode layer having the photo resist pattern as a mask; forming the PIN structure by etching the PIN layer; etching an edge area of the upper electrode having the photo resist pattern as a mask; and removing the photo resist pattern.

Herein, the etching of the upper electrode layer or the etching of the edge area of the upper electrode may be performed using a wet etching process.

Furthermore, the etching of the PIN layer may be performed using a dry etching process.

Furthermore, upper electrode layer may be made of ITO, and a temperature at which the upper electrode layer is deposited may be between 200° C. and 250° C.

Furthermore, the etching of the edge area of the upper electrode may be performed such that a length of between 1 µm and 3 µm of the edge area is etched.

Furthermore, the etching of the edge area of the upper electrode may be performed such that an end of the upper electrode corresponds to an end of the PIN structure.

According to another aspect, there is provided a manufacturing method of an x-ray detector having a lower electrode, that is a source electrode or drain electrode of a thin film transistor, a PIN structure consisting of a P layer, an I layer, and a N layer formed above the lower electrode, and an upper electrode formed above the PIN structure, the method including forming a lower electrode layer, and forming the lower electrode by etching the lower electrode layer; forming, above the lower electrode, a protection film having a contact hole which exposes a part of the lower electrode; depositing a PIN layer for formation of the PIN structure above the lower electrode such that it is electrically connected to the lower electrode through the contact hole, and depositing an upper electrode layer for formation of the upper electrode above the PIN layer; forming a photo resist pattern above the upper electrode layer, and forming the upper electrode by etching the upper electrode layer having the photo resist pattern as a mask; forming the PIN structure by etching the PIN layer; etching an edge area of the upper electrode having the photo resist pattern as a mask; and removing the photo resist pattern.

Various aforementioned aspects of the present disclosure have an effect of providing a PIN diode wherein a size of an upper electrode of the PIN diode is formed such that it corresponds to a size of a PIN structure thereby maximizing a fill factor of the PIN diode, and a manufacturing method thereof, and an x-ray detector using the PIN diode and a manufacturing method thereof.

Various aforementioned aspects of the present disclosure have another effect of providing a PIN diode wherein an upper electrode is deposited above the PIN diode at a high temperature thereby preventing the upper electrode from coming off, and a manufacturing method thereof, and an x-ray detector using the PIN diode and a manufacturing method thereof.

Other features and aspects will be apparent from the following detailed description, the drawings, and the claims.

DETAILED DESCRIPTION

Figure 1:
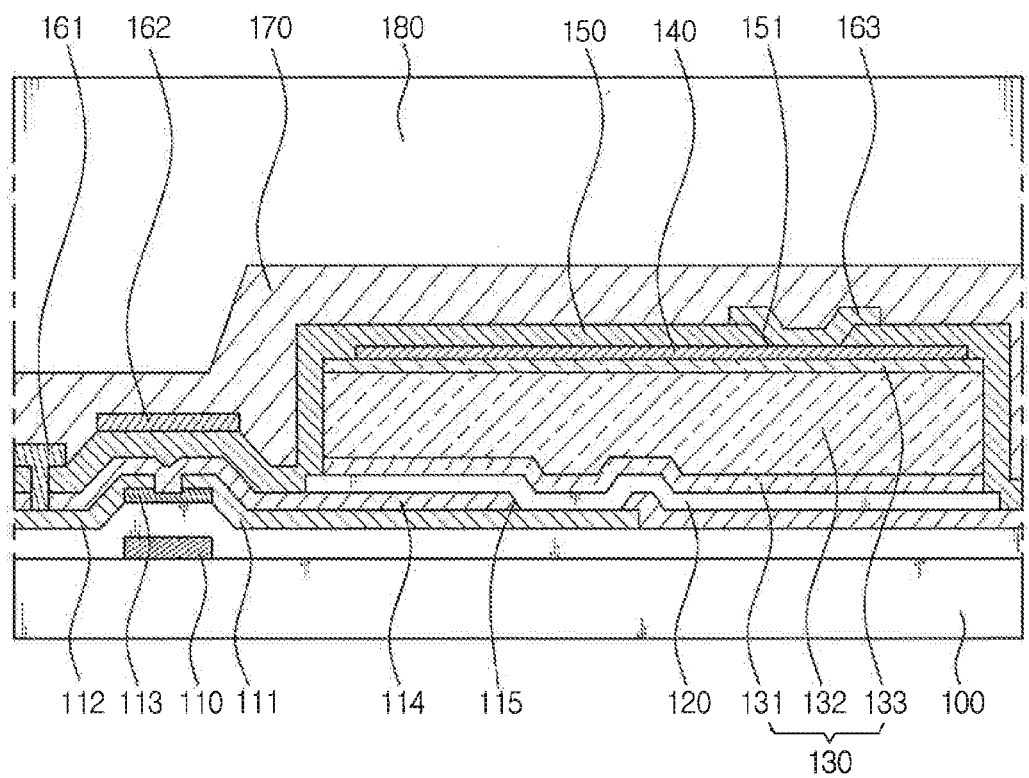
FIG. 1 is a schematic diagram illustrating a conventional x-ray detector.
Figure 2:
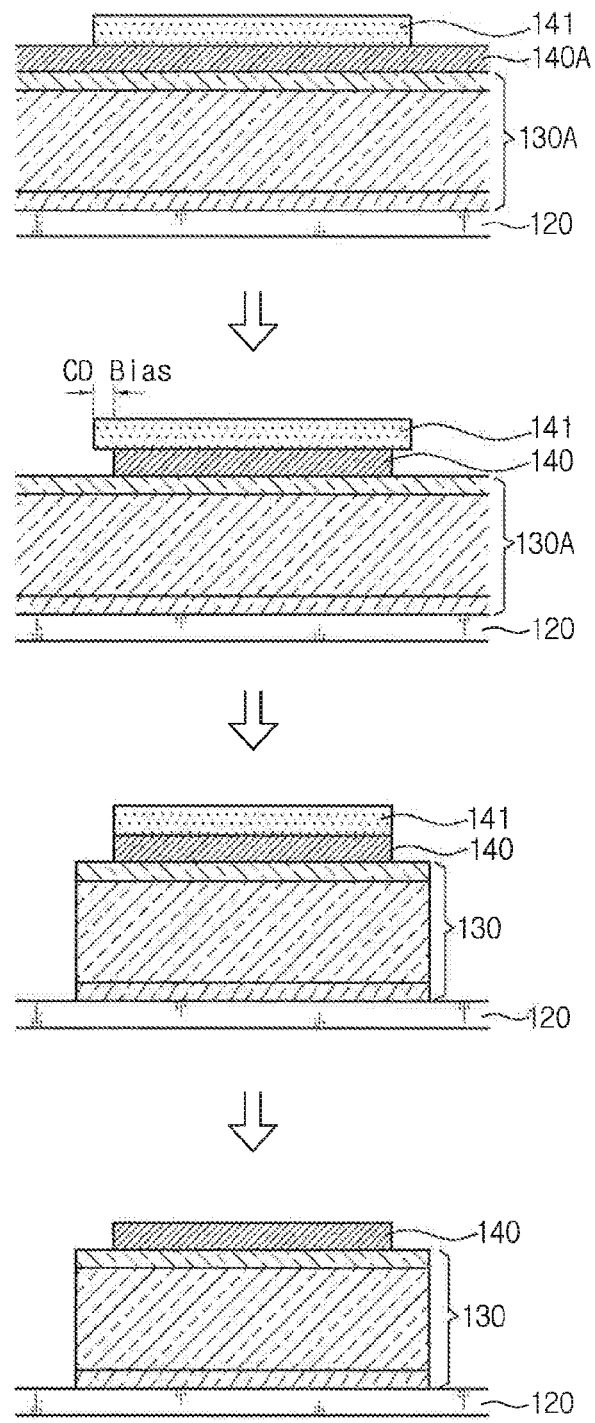
FIG. 2 is a process diagram of a conventional manufacturing method of an x-ray detector.

The following detailed description is provided to assist the reader in gaining a comprehensive understanding of the methods, apparatuses, and/or systems described herein.

However, various changes, modifications, and equivalents of the systems, apparatuses, and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness The features described herein may be embodied in different forms, and are not to be construed as being limited to the examples described herein. will be thorough and complete, and will convey the full scope of the disclosure to one of ordinary skill in the art.

In the various embodiments, components having the same configurations are referred to using the same reference numerals, and thus the components will be explained with reference to the first embodiment, and in other embodiments, only the components different from the first embodiments will be explained.

Hereinafter, a manufacturing method of an x-ray detector according to an embodiment of the present disclosure will be explained in detail with reference to the drawings attached.

By the manufacturing method of the x-ray detector according to an embodiment of the present disclosure, a PIN diode is formed that includes a lower electrode, PIN structure, and upper electrode. The lower electrode of the PIN diode may be provided separately such that it is electrically connected to a drain electrode or a source electrode of a thin film transistor, or instead of being separately provided, the lower electrode may be a source electrode or a drain electrode of a thin film transistor.

In the manufacturing method of the x-ray detector according to a first embodiment of the present disclosure, explanation will be made on a case where the lower electrode of the PIN diode is provided separately and is electrically connected to a drain electrode of a thin film transistor.

First of all, on a substrate, a thin film transistor (not illustrated) is formed that includes a gate electrode, a source electrode, a drain electrode and an active pattern. Then, a protection film (not illustrated) having a contact hole is formed such that it exposes a part of the drain electrode while covering a result is formed such that it exposes a part of the drain electrode while covering a result product of the thin film transistor.

Figure 3:
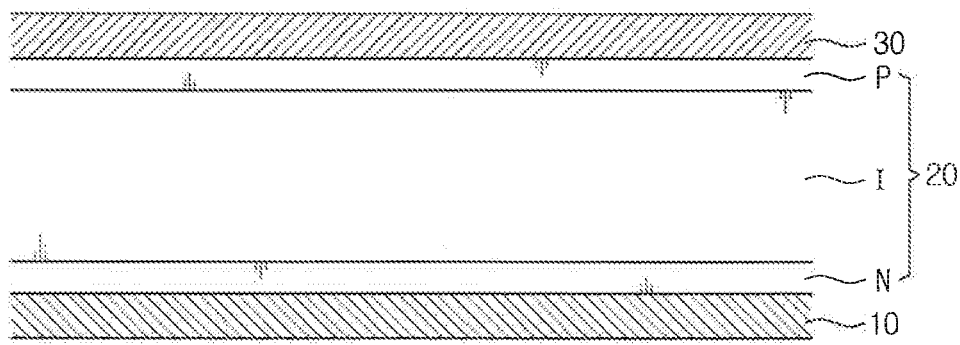
FIGS. 3 through 8 are process diagrams of a manufacturing method of an x-ray detector according to an embodiment of the present disclosure.

FIGS. 3 through 8 are process diagrams of a manufacturing method of an x-ray detector according to a first embodiment of the present disclosure. Referring to FIG. 3, a lower electrode 10 is formed that is electrically connected to the drain electrode through the contact hole of the thin film transistor as aforementioned.

The lower electrode 10 may be formed by depositing a lower electrode layer, and etching the same using a predetermined photo resist pattern.

Furthermore, the lower electrode 10 is formed such that it is electrically connected to the drain electrode through the contact hole.

The lower electrode 10 and an upper electrode 31 that will be explained hereinafter may be a P side electrode or N side electrode, selectively.

The P side electrode or the N side electrode may be made of a transparent conductive material such as ITO (Indium Tin Oxide) or IZO (Indium Zinc Oxide).

Furthermore, above the lower electrode 10, a PIN layer 20 including an N layer, I layer, and P layer for formation of a PIN structure 21, and an upper electrode layer 30 are deposited sequentially.

Herein, the upper electrode layer 30 is made of ITO or IZO, and the temperature at which the upper electrode layer 30 is deposited is 200° C. to 250° C., and desirably 230° C.

Figure 4:
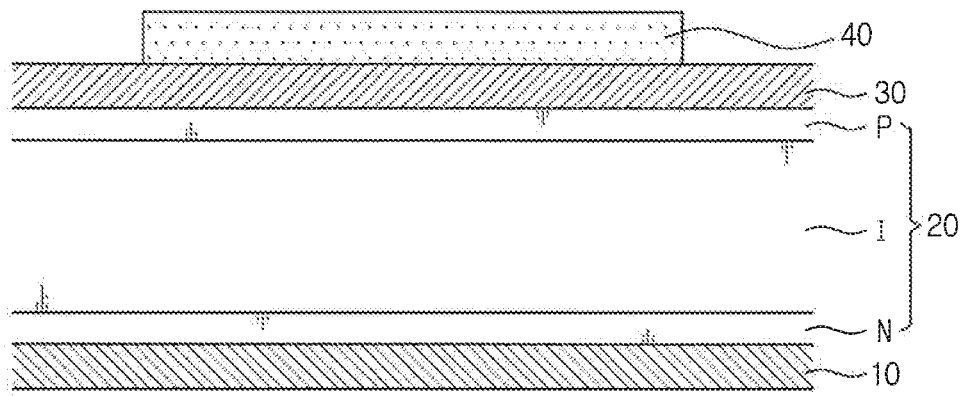
Figure 5:
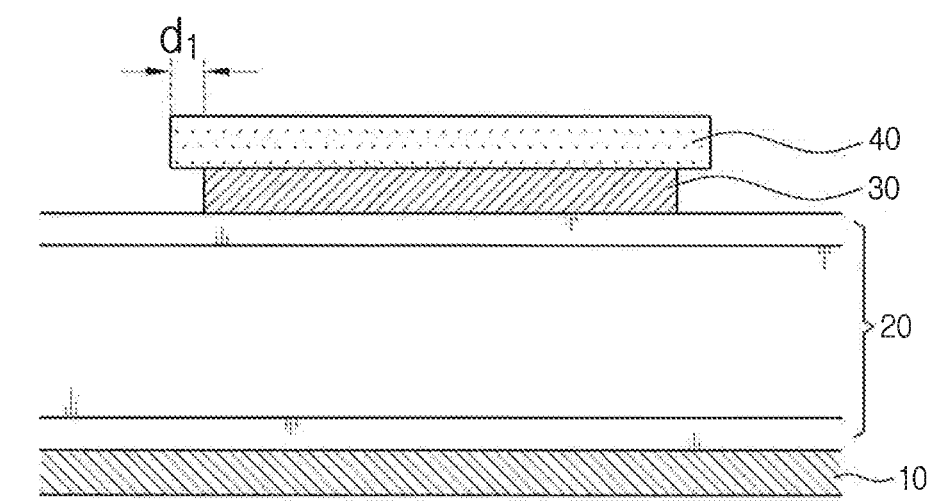

That is, by forming the upper electrode layer 30 at a high temperature, the adhesion force with the PIN layer 20 is improved while reducing Then, as illustrated in FIG. 4, a photo resist pattern 40 is formed above the upper electrode layer 30, and then as illustrated in FIG. 5, the upper electrode layer 30 is etched using a wet etching process having the photo resist pattern 40 as a mask.

When using the wet etching process, the upper electrode layer 30 is excessively-etched than the photo resist pattern 40 so as to form an upper electrode 31 having a CD Bias ($d_1$) of between about 0.5 μm and 1 μm.

Figure 6:
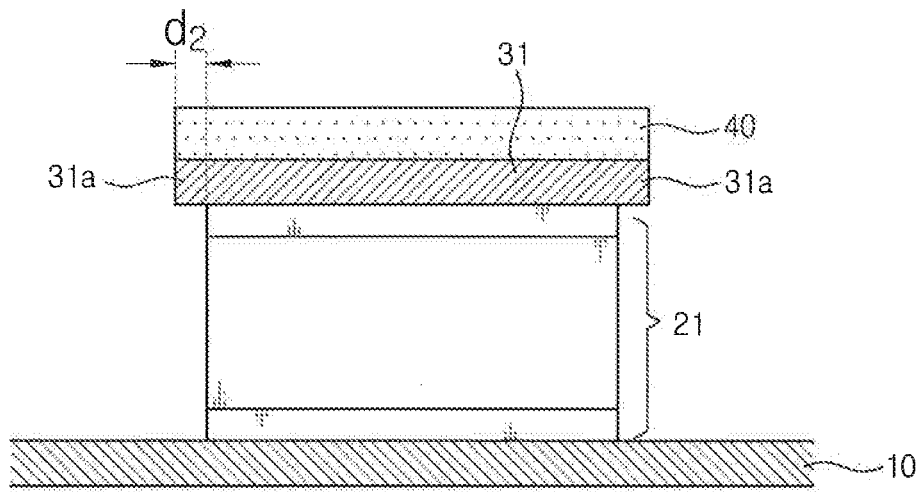

Furthermore, as illustrated in FIG. 6, using a dry etching process, the PIN layer 20 is etched to form a PIN structure 21.

The etching of the PIN layer 20 makes an edge area 31a of the upper electrode 31 to protrude further beyond an end of the PIN structure 21.

Herein, the length of the edge area 31a of the upper electrode 31 is the CD Bias ($d_2$) of the PIN structure 21, that is between about 1 μm and 3 μm.

Furthermore, the said dry etching process is a physical etching process, and by such an etching process, a part of the edge area of the photo resist pattern 40 is etched such that it substantially corresponds to the end of the upper electrode 31 that is below the photo resist pattern 40.

In other words, the upper electrode 31 is formed to be bigger than the PIN structure 21, and thus the edge area 31a of the upper electrode 31 protrudes further beyond the size of the PIN structure 21.

Figure 7:
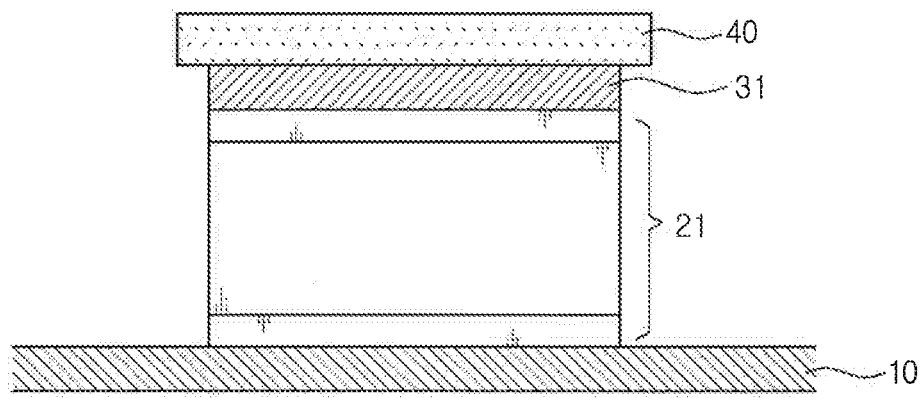

Then, as illustrated in FIG. 7, having the photo resist pattern 40 as a mask, the edge area 31a of the upper electrode 31 is etched by a wet etching process.

Herein, it is desirable that the upper electrode 31 is etched such that its end corresponds to the end of the PIN structure 21.

A wet etching fluid to be used in the said wet etching process is one that can etch only the upper electrode layer 30, and thus, during the etching, only the edge area 31a of the upper electrode 31 is etched and not the PIN structure 21.

That is, the size of the upper electrode 31 from which only the edge area 31a of the upper electrode 31 has been removed is formed to substantially correspond to the size of the PIN structure 21.

Figure 8:
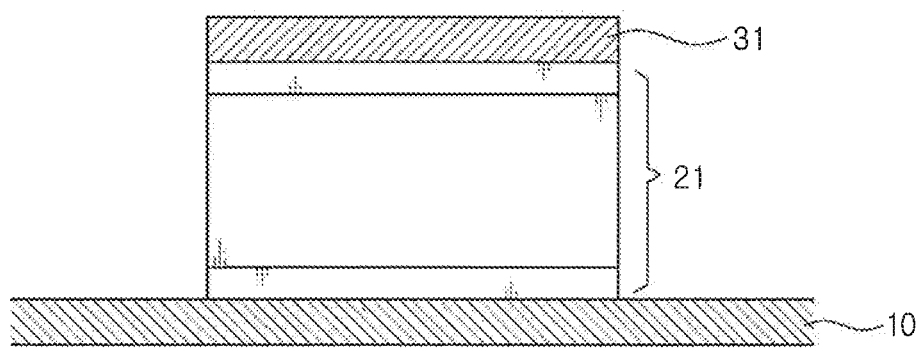

Furthermore, as illustrated in FIG. 8, the photo resist pattern above the upper electrode 31 is removed, and thus the process is completed.

According to the aforementioned method, it is possible to manufacture an x-ray detector having an upper electrode 31 and a PIN structure 21 with the same size.

According to the aforementioned manufacturing method of an x-ray detector, as the upper electrode is subjected to an etching process twice, it is possible to maximize the fill factor of the PIN diode, thereby maximizing an amount of conversion into electrical signals with a same amount of visible rays.

Furthermore, unlike in the conventional technique, it is possible to etch a protruding unit while reducing the number of masks, and by depositing the upper electrode at a high temperature, it is possible to prevent the upper electrode from coming off.

Next, a manufacturing method of an x-ray detector according to a second embodiment of the present disclosure will be explained. The second embodiment is a case where the lower electrode of the PIN diode is a drain electrode of a thin film transistor, instead of being separately provided.

In such a case where the lower electrode of the PIN diode is a drain electrode of the thin film transistor, first of all, the drain electrode of the thin film transistor, that is the lower electrode, is formed, and then above the lower electrode, a protection film having a contact hole is formed such that it exposes a part of the drain electrode.

Then, above the protection film, a PIN layer is deposited such that it is electrically connected to the drain electrode of the thin film transistor, that is the lower electrode, through the contact hole of the protection film, and then an upper electrode layer is deposited sequentially. Then, subsequent processes are performed in the same manner as in the aforementioned first embodiment.

Meanwhile, although the aforementioned PIN diode configuration and manufacturing method of the present invention were applied to an x-ray detector in the aforementioned embodiments, the PIN diode configuration and manufacturing method of the present invention may be applied to any apparatus other than an x-ray detector.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method of a PIN diode having a lower electrode, a PIN structure consisting of a P layer, an I layer, and a N layer formed above the lower electrode, and an upper electrode formed above the PIN structure, the method comprising:
   forming a lower electrode layer, and forming the lower electrode by etching the lower electrode layer;
   depositing a PIN layer for formation of the PIN structure above the lower electrode, and depositing an upper electrode layer for formation of the upper electrode above the PIN layer;
   forming a photo resist pattern above the upper electrode layer, and forming the upper electrode by etching the upper electrode layer by means of the photo resist pattern as a mask;
   forming the PIN structure which has a smaller width than a width of the upper electrode by etching the PIN layer without removing the photo resist pattern;
   etching an edge area of the upper electrode which protrudes the PIN structure by means of the photo resist pattern as a mask; and
   removing the photo resist pattern after etching the edge area of the upper electrode.

2. The method according to claim 1,
   wherein the etching of the upper electrode layer or the etching of the edge area of the upper electrode is performed using a wet etching process.

3. The method according to claim 1,
   wherein the etching of the PIN layer is performed using a dry etching process.

4. The method according to claim 1,
   wherein the upper electrode layer is made of ITO, and a temperature at which the upper electrode layer is deposited is between 200° C. and 250° C.

5. The method according to claim 1,
   wherein the etching of the edge area of the upper electrode is performed such that a length of between 1 μm and 3 μm of the edge area is etched.

6. The method according to claim 1,
   wherein the etching of the edge area of the upper electrode is performed such that an end of the upper electrode corresponds to an end of the PIN structure.

7. A manufacturing method of an x-ray detector having a lower electrode, that is a source electrode or drain electrode of a thin film transistor, a PIN structure consisting of a P layer, an I layer, and a N layer formed above the lower electrode, and an upper electrode formed above the PIN structure, the method comprising:
   forming a lower electrode layer, and forming the lower electrode by etching the lower electrode layer;
   forming, above the lower electrode, a protection film having a contact hole which exposes a part of the lower electrode;
   depositing a PIN layer for formation of the PIN structure above the lower electrode such that it is electrically connected to the lower electrode through the contact hole, and depositing an upper electrode layer for formation of the upper electrode above the PIN layer;
   forming a photo resist pattern above the upper electrode layer, and forming the upper electrode by etching the upper electrode layer by means of the photo resist pattern as a mask;
   forming the PIN structure which has a smaller width than a width of the upper electrode by etching the PIN layer without removing the photo resist pattern;
   etching an edge area of the upper electrode which protrudes the PIN structure by means of the photo resist pattern as a mask; and
   removing the photo resist pattern after etching the edge area of the upper electrode.

8. The method according to claim 7,
   wherein the etching of the upper electrode layer or the etching of the edge area of the upper electrode is performed using a wet etching process.

9. The method according to claim 7,
   wherein the etching of the PIN layer is performed using a dry etching process.

10. The method according to claim 7,
    wherein the upper electrode layer is made of ITO, and a temperature at which the upper electrode layer is deposited is between 200° C. and 250° C.

11. The method according to claim 7,
    wherein the etching of the edge area of the upper electrode is performed such that a length of between 1 μm and 3 μm of the edge area is etched.

12. The method according to claim 8,
   wherein the etching of the edge area of the upper electrode is performed such that an end of the upper electrode corresponds to an end of the PIN structure.

* * * * *